US008587234B2

(12) United States Patent
Villwock et al.

(10) Patent No.: US 8,587,234 B2
(45) Date of Patent: Nov. 19, 2013

(54) APPARATUS AND METHOD FOR ROTATING-SENSORLESS IDENTIFICATION OF EQUIVALENT CIRCUIT PARAMETERS OF AN AC SYNCHRONOUS MOTOR

(75) Inventors: Sebastian Villwock, Pechbrunn (DE); Heiko Zatocil, Nuremberg (DE)

(73) Assignee: Baumuller Nurnberg GmbH, Nuremberg (DE)

( * ) Notice: Subject to any disclaimer, the term of this patent is extended or adjusted under 35 U.S.C. 154(b) by 207 days.

(21) Appl. No.: 13/205,760

(22) Filed: Aug. 9, 2011

(65) Prior Publication Data

US 2012/0038298 A1 Feb. 16, 2012

(30) Foreign Application Priority Data

Aug. 16, 2010 (EP) .................................... 10172910

(51) Int. Cl.
*H02P 21/00* (2006.01)
*H02P 6/00* (2006.01)
(52) U.S. Cl.
USPC ............. 318/400.11; 318/400.01; 318/700; 318/400.32; 318/400.33
(58) Field of Classification Search
USPC ............. 318/400.11, 400.34, 400.12, 700, 318/400.01, 400.32, 400.33
See application file for complete search history.

(56) References Cited

U.S. PATENT DOCUMENTS

| 4,678,248 A | * | 7/1987 | Depenbrock | 318/805 |
| 4,967,134 A | * | 10/1990 | Losic et al. | 318/802 |
| 5,134,349 A | * | 7/1992 | Kruse | 318/400.34 |
| 5,202,613 A | * | 4/1993 | Kruse | 318/400.04 |
| 5,321,342 A | * | 6/1994 | Kruse | 318/400.04 |
| 5,629,598 A | * | 5/1997 | Wilkerson | 318/808 |

(Continued)

FOREIGN PATENT DOCUMENTS

JP 2000 032800 A 1/2000

OTHER PUBLICATIONS

Villwock, Sebastian; Pacas, Mario; Eutebach, Thomas, Application of the Welch-Method for the Automatic Parameter Identification of Electrical Drives, Industrial Electronics Society, 2005, 31lst Annual Conference of IEEE, Piscataway, NJ, Nov. 6, 2005, pp. 1449-1454.
Vermeulen, H.J.; Strauss, J.M., Off-line Identification of an Open-Loop Automatic Voltage Regulator using Pseudo-Random Binary Sequence Perturbations, AFRICON, 1999 IEEE Cape Town, South Africa, Sep. 28, 1999-Oct. 1, 1999, Piscataway, NJ, IEEE, Sep. 28, 1999, pp. 799-802.

(Continued)

*Primary Examiner* — Rita Leykin
(74) *Attorney, Agent, or Firm* — Frank H. Foster; Kremblas & Foster

(57) ABSTRACT

Identification without shaft encoder of electrical equivalent circuit parameters of a three-phase asynchronous motor comprising: -standstill position search of the rotor, so that the d flux axial direction of the rotor is aligned opposite the cc axial direction of the stator; -test signal voltage supply $U_{1d}$ in the d flux axial direction of the motor whereby the q transverse axial direction remains without current; -measuring signal current $I_{1d}$ of the d flux axial direction of the motor; -identification of equivalent circuit parameters of the motor based on the test signal voltage $U_{1d}$ and on the measuring signal current $I_{1d}$ in the d flux axial direction; whereby the rotor remains torque-free. The method used to control electrical drives. An identification apparatus for a synchronous motor and a motor control device comprising the apparatus, whereby identified equivalent circuit parameters can be used to determine, optimize and monitor a motor control.

12 Claims, 7 Drawing Sheets

(56) References Cited

U.S. PATENT DOCUMENTS

| | | | | |
|---|---|---|---|---|
| 5,854,548 | A | * | 12/1998 | Taga et al. ..................... 318/721 |
| 5,929,400 | A | * | 7/1999 | Colby et al. .................. 187/393 |
| 6,774,664 | B2 | * | 8/2004 | Godbersen .................... 324/545 |
| 7,116,070 | B2 | * | 10/2006 | MacKay .................. 318/400.11 |
| 7,482,777 | B2 | * | 1/2009 | Tomigashi .................... 318/807 |
| 2010/0060210 | A1 | | 3/2010 | Liu et al. |

OTHER PUBLICATIONS

Villwock, Sebastian; Baumuller, Andreas; Pacas, Mario; Gotz, Fritz-Rainer; Liu, Biao; Barinberg, Viktor, Influence of the Power Density Spectrum of the Excitation Signal on the Identification of Drives, Industrial Electronics, 34th Annual Conference of IEEE, Piscataway, NJ, Nov. 10, 2008, pp. 1252-1257.

* cited by examiner

APPARATUS AND METHOD FOR ROTATING-SENSORLESS IDENTIFICATION OF EQUIVALENT CIRCUIT PARAMETERS OF AN AC SYNCHRONOUS MOTOR The present invention starts from a method, a device, an apparatus and the use of a method for an identification of electrical equivalent circuit parameters of a three-phase synchronous motor. Electrical equivalent circuit parameters make possible the characterization of a three-phase motor by electrical equivalent circuit components so that the electrical behavior of the motor can be simulated in operation.

STATE OF THE ART

Various methods are known from the state of the art for determining the electrical behavior of a three-phase motor. As a rule, direct current tests and short-circuit tests are performed on a motor in order to measure the electrical behavior in such operating scenarios and to be able to derive from it the electrical operating behavior for other operating instances. A three-phase synchronous motor comprises a stator with at least three stator coils and comprises a rotor with a permanent magnetization that is caused either by permanent magnets or is generated by coils through which direct current flows and that are supplied with brushes. Typically, a so-called equivalent circuit is used to characterize the electrical behavior of a synchronous motor in which equivalent circuit the stator coil is simulated by an ohmic resistance $R_1$ and an inductivity $L_1$ as well as a voltage source $U_p$ for taking account of the mutual-induced voltage. The attempt is typically made with direct current tests and short-circuit tests to determine the magnitude of the concentrated structural part parameters of the equivalent circuit for three-phase motors. The previously cited tests represent time range methods in which the motor moves and that require a drive of the motor in a test environment. In the short-circuit test the motor must be secured, whereby the danger of an overloading can result. In a direct current test the ohmic stator resistance $R_1$ can be determined, whereby the danger of an electrical overloading can result. The inductivity $L_1$ can be deduced from the short-circuit test.

The previously cited short-circuit test and direct current test take into account in many instances measured results of mechanical sensors such as, for example, position sensors, angle sensors or speed sensors in order to be able to deal rival correlation of operating behavior of the motor at different speeds.

In a three-phase system in a Y or Δ circuit the current results by feeding two phases according to the rule $I_u+I_v+I_w=0$ with lacking star point grounding. For this reason a three-phase system can also be described with two coordinates, whereby in order to describe the total current a coordinate system can be considered in the complex plane in which the two coordinates real part and imaginary part can be designated as α and β coordinates as regards the stationary alignment of the stator windings according to FIG. 1. The α/β coordinate system describes, for example, the direction of the current flux or the rotor flux axis in the resting reference system of the stator of the three-phase motor. As regards the magnetic alignment of the rotor, a second rotating coordinate system can be introduced whose axes are designated as the d axis and the q axis of the rotor, as is shown in FIG. 2. The d axis designates the direction of the magnetic flux of the rotor and the q axis designates the transverse flux axis at a right angle to it. A transformation of an α/β stator coordinate system into the rotating d/q rotor coordinate system can be brought about via the angle of rotation $\beta_k$ between the winding axis of the phase U of the stator and between the longitudinal axis of the rotor magnetic field. In this regard a total motor current I or its three-phase currents $I_U$, $I_V$ and $I_W$ can be considered in the stator-fixed α/β coordinate system or in the d/q coordinate system rotating with the rotor. As regards the conversion of the phase currents of the three-phase synchronous motor into the α/β coordinate system, the following relationship applies:

$$\begin{pmatrix} i_\alpha \\ i_\beta \end{pmatrix} = \begin{pmatrix} 1 & 0 & 0 \\ 0 & \frac{\sqrt{3}}{3} & -\frac{\sqrt{3}}{3} \end{pmatrix} \begin{pmatrix} i_u \\ i_o \\ i_w \end{pmatrix}.$$

$$\begin{pmatrix} i_x \\ i_y \\ i_w \end{pmatrix} = \begin{pmatrix} 1 & 0 \\ -\frac{1}{2} & \frac{\sqrt{3}}{2} \\ -\frac{1}{2} & -\frac{\sqrt{3}}{2} \end{pmatrix} \begin{pmatrix} i_\alpha \\ i_\beta \end{pmatrix}.$$

that can be modified by taking into account the angle of rotor flux $\beta_k$ opposite the stator for the d/q coordinate system. For the following mathematical detection of the relationships a consideration is carried out in the α/β stator coordinate system according to FIG. 2, whereby the equivalent circuit shown in FIG. 4 describes an equivalent circuit characterization of the three-phase synchronous machine in a single-phase system with feed voltages and currents $U_1$, $I_1$ as well as $U_2$, $I_2$.

FIG. 4 shows the equivalent circuit of a synchronous motor in standstill (n=0) in relation to an α/β display diagram without reluctance influences, whereby, given knowledge of the cited equivalent circuit magnitudes, the electrical operating behavior of the three-phase motor can be estimated in a different instances of operation:

$$U_{1\alpha} = R_1 I_{1\alpha} + L_1 \frac{dI_{1\alpha}}{dt}$$

$$U_{1\beta} = R_1 I_{1\beta} + L_1 \frac{dI_{1\beta}}{dt}.$$

The two differential equations represent a PT1 behavior in the frequency range. The admittance of the motor in the operating behavior can be determined from this, which admittance results in accordance with the following equation:

$$G = \underline{Y} = \frac{1}{R_1 + sL_1} = \frac{1}{b_0 + sb_1}.$$

The above-cited admittance as transmission function $G=\underline{Y}=I_{1d}/U_{1d}$ is derived under the assumption of a speed n=0, since no countervoltage results in the stator coils here and the term $U_p$ can be disregarded.

Starting from the phase voltages $U_U$, $U_V$ and $U_W$ and phase currents $I_U$, $I_V$ and $I_W$, they are converted in accordance with the above transformation into the d/q coordinate system. Thus, the electrical behavior of the three-phase synchronous machine can be considered with the aid of the input magnitude $U_1$ and output magnitude $I_1$. In this regard, separate modes of consideration regarding the d and q coordinates can be carried out, so that the transmission function or admittance results:

$$G_1=I_{1d}/U_{1d}$$

The unknown coefficients of the transmission function can be determined by determining the transmission function $G_1$.

The use of a pseudo-noise binary signal (PRBS) as electrical test activation is known from the state of the art for determining mechanical characteristics of a three-phase motor, in particular for diagnosing the errors of mechanical parts or for mechanical system identification during operation in a mechanical connection. The mechanical system constitutes an SISO system here (Single-Input Single-Output) in which a single mechanical output magnitude can be measured with the aid of a single mechanical or electrical input magnitude. The input magnitude is excited with the aid of the pseudo-noise binary signal so that a broadband behavior of the SISO can be determined in the output magnitude. Characteristics of the mechanical system can be derived with the aid of theoretical signal methods of frequency transformation and parameter identification using the frequency behavior given knowledge of the basic system equation.

However, in the case of electrical characteristic quantities a so-called MIMO system (Multiple-Input Multiple-Output) is involved in which several input magnitudes (phase voltages) must be fed in and several output magnitudes (phase currents) must be extracted. For this reason the methods known from the process for the identification of mechanical magnitudes cannot be used for the electrical system characterization of a three-phase motor. The identification of the mechanical system is comprehensively described in the dissertation of Sebastian Villwock "Identifikationsmethoden für die automatisierte Inbetriebnahme and Zustandsüberwachung elektrischer Antriebe" [German—"Identification Methods for the Automated Starting and Status Monitoring of Electrical Drives", University of Siegen, 2007, (publication [1]). Furthermore, a theoretical signal method for the parameter identification of the mechanical system which method is used in this regard is described in the journal contribution: S. Villwock, J. M. Pacas: "Application of the Welch-Method for the Identification of Two and Three Mass Systems", IEEE Transactions on Industrial Electronics, Vol. 55, No. 1, January 2008, pp. 457-466 (publication [2]). A method which is generically similar was presented in the framework of a conference article in: P. Szczupak, J. M. Pacas: "Automatic Identification of a PMSM Drive Equipped with an Output LC-Filter", IEEE Industrial Electronics, IECON 2006, 32$^{nd}$ Annual Conference on November 2006, pp. 1143-1148 (publication [3]).

The present invention has the problem, starting from an electrical equivalent circuit of a three-phase synchronous machine, of suggesting a method for determining the equivalent circuit characteristic quantities, whereby a parameter identification without electrical or mechanical loading of the motor is made possible, the rotor stands still and all electrical equivalent circuit parameters for a description of the element behavior of the three-phase motor can be determined for a large frequency range by a single measurement. Advantageous further developments of the invention are subject matter of the subclaims.

DISCLOSURE OF THE INVENTION

In a first aspect of the invention a method is suggested for the identification of electrical equivalent circuit parameters of a three-phase synchronous motor without shaft encoder which method comprises at least the following steps:
standstill position search of the rotor, so that the d flux axial direction of the rotor is aligned opposite the α axial direction of the stator;
test signal voltage supply $U_{1d}$ in the d flux axial direction of the synchronous motor, whereby the q transverse axial direction remains without current;
measuring signal current measurement $I_{1d}$ of the d flux axial direction of the synchronous motor;
identification of equivalent circuit parameters of the synchronous motor based on the test signal voltage $U_{1d}$ and on the measuring signal current $I_{1d}$ in the d flux axial direction;
whereby the supplying of a test signal into the synchronous motor takes place in such a manner that the rotor remains torque-free, i.e., does not move.

A standstill position of the rotor means that the angle of the rotor opposite the stator does not change and therefore the angle of rotation between the α axis and the d axis is constant and possibly known. After the assumption of a standstill position of the rotor a test signal voltage is supplied into the d flux axial direction of the rotor and the resulting measuring signal current measured. A current impression in the d axial direction brings about an alignment of the rotor, whereby no torque is exerted on the rotor. The structure of the test signal determines which frequency components or frequency areas can be measured and with which accuracy the equivalent circuit parameters can be identified, whereby parameters can be extracted in accordance with the frequency cover of the test signal. A supply of the test voltage $U_{1d}$ generates a measuring signal current $I_{1d}$ that can be determined.

In contrast to an asynchronous motor, given an identical supply of the test signal in both rotor axial directions d and q, a formation of torque and therefore a mechanical movement of the motor shaft would occur. In order to avoid this, a rest position search can be carried out at first in order that the position of the d flux axis is known. In distinction to the asynchronous machine, the frequency response measuring subsequently takes place by supplying the test signal exclusively in the d direction, since the d component of the stator current $I_{1d}$ does not contribute to the formation of torque.

The rest position search can be avoided in a first step in that the supplying of the machine with current in the a direction takes place with a direct current. Then, the rotor aligns itself on the a axis so that a axis and d axis coincide. Thus, the test signal can be supplied into the three-phase motor in a second step via the a axis, that now coincides with the d axis. As a result, the self-identification takes place moment-free and the motor shaft executes no mechanical movement. Alternatively, if the rest position alias pole position of the synchronous machine is known a priori, the test signal can also be supplied directly as voltage $U_{1d}$ in a suitable manner into the stator windings.

The supplying of the phase voltage can take place, for example, by a ⅔ phase converter, can generate the three phase voltages $U_U$, $U_V$ und $U_W$ following the above matrix relation and observing the rotor angle of rotation $\beta_k$ from the two voltages $U_{1d}$ und $U_{1q}$, and can transform the two currents $I_{1d}$ und $I_{1q}$ from the three measured currents $I_U$, $I_V$ und $I_W$. A supplying of the test signal can take place, for example, by a controlling of an inverter of the motor control device of the three-phase motor. Alternatively, the test signal voltage can be supplied directly into the phases of the synchronous machine in accordance with the position of the d axis while avoiding the motor control inverter. The measuring of the phase currents can take place via the same current measuring instruments that are used in the operation of the three-phase motor during a regulation without shaft encoder. In the time range the supplied test signal voltages and the measured measuring signal currents can be recorded as digitally detected scanning values in time and on their basis the equivalent circuit parameters can be extracted. This preferably takes place by a frequency range analysis, i.e., by a frequency transformation of the recorded time-range data, and by an analysis of the frequency response of the measured transmission function $G_1$. Given knowledge of the previously-cited admittance function, that can be represented as a transmission function in the frequency range, the parameters of the transmission function can be determined by a suitable signal-theoretical method, whereby these parameters can be used to identify the equivalent circuit characteristic quantities $R_1$ and $L_1$.

During the supplying of the test signal into the d rotor coordinate direction no torque is produced in the machine, so that the rotor remains torque-free and remains in this position. As a result, a measuring can be carried out in the standstill of the motor, whereby no sensor data has to be taken into account and even the parameters of a motor can be extracted in the assembled state inside a mechanical drive line after the equivalent circuit parameters without the type of the drive line influencing the measured results. To this end it can be advantageously conceivable to vary the level of the test signal voltage $U_{1d}$ and to carry out parameter identifications with altered voltage values, whereby the resulting parameters can be determinable as an average or a weighted parameter from the results of the individual parameter identifications. In this manner errors can be reduced in the determination so that a more exact result can be achieved.

A determination of the frequency response of the transmission function G with knowledge of the basis admittance formula Y makes the extraction of the equivalent circuit parameters possible. Thus, statements about the equivalent circuit characteristic quantities of the three-phase motor can be made by a supplying of a test signal which is in particular a broadband one by means of a single measurement. To this end signal-theoretical methods are used that transform the measured time range data into frequency range data, whereby the frequency response can be detected with formulas and the parameters of the basic transmission function and therewith the equivalent circuit magnitudes can be identified by a parameter extraction from the frequency response.

Basically, instead of a set test voltage and determination of the measuring current a set test current with detection of the measuring voltage can also take place. However, in particular powerful motors have a highly inductive behavior so that in order to impress rectangular current switching pulses high driver voltages would have to be applied, as result of which an impressing of tests current is possible only with great expense.

According to an advantageous further development of the invention the standstill position can be a rest position, i.e., magnet wheel position of the rotor, at which the d flux axial direction of the rotor coincides with the $\alpha$ axial direction of the stator, or can be a previously known rotor position or a forced standstill obligatory position by a constant supplying of the synchronous motor with current in an $\alpha$ axial direction. If the d flux axial direction of the rotor coincides with the $\alpha$ axial direction of the stator, then the rotor position angle $\beta_k=0$, i.e., a defined magnet wheel angle is assumed. Thus, a supplying of currents in the $\alpha$ axial direction brings about an alignment of the d flux axial direction, whereby the rotor remains torque-free. If a rotor position is known, for example, by a defined mechanical stop or information about a position by a sensor for angular rotation, the stator windings can be supplied with current in the positional direction of the d rotor axis. Also, a constant supplying of the stator coils with current in any position can force an alignment of the d axis in the axis of the stator magnetic field which is being adjusted. A rest position alignment has the advantage that even after the ending of a constant supplying of current the rotor remains fixed in this position so that sufficiently small test signal voltages that can themselves have a low q axial component cannot bring about an undesired rotary movement of the rotor from the rest position. A method for the rest position search has already been implemented in many motor control apparatuses known from the state of the art.

According to an advantageous further development the test signal can be a pseudo-noise binary signal. The test signal should have a high bandwidth in order to make possible the highest possible frequency resolution of the electrical motor behavior. White noise has a uniformly distributed broadband frequency spectrum. A pseudo-noise binary signal (PRBS) is a binary signal that approximates the spectrum of white noise. It can typically assume the values +1 and −1 and is used alternatively to white noise. In particular, the reproducibility of the signal is advantageous, whereby a PRB signal is frequently used in regulating technology for the analysis of an impulse response by means of a maximum length sequence. A PRB test signal can be easily generated by linear feedback shift registers and can be generated, for example, by a DPS (Digital Signal Processor), FPGA (Field Programmable Gate Array) or microcontrollers of a motor regulator for controlling the inverter. Thus, every motor control electronic system can generate such a PRB signal without great modification and feed it in as motor voltage into the motor.

Basically, a frequency range transformation of scanned time range data can take place as desired for the identification of the equivalent circuit parameters in the frequency range. According to an advantageous further development of the invention the identification of the equivalent circuit parameters can comprise a Fourier transformation in accordance with a periodogram method, preferably a Bartlett method, in particular a Welch method. A spectral power density is achieved in the framework of a periodogram method by a Fourier transformation of individual data blocks. The quality of the spectral estimation can be improved in that a number of periodograms that are independent of each other are averaged. This method is known in the literature under the name of the Bartlett method, in which the measured signal is divided into sections. The Welch method represents an expansion of the procedure suggested by Bartlett. Certain window functions can be used here to reduce the leakage effect. The disturbing leakage effect occurs when the signal section is not periodic, a whole multiple of the period or when this signal section is on the edges of zero. The use of a Welch method in the identification of a system of two or of three units is already known from the above-cited publication [2]. The Welch method splits M scanning values into K partial sequences that are weighted with a window function and is applied to a Fourier transformation. The Welch method described in the publication [1] makes possible the transformation of any number of scanning values with the greatest possible accuracy into the frequency range. The time range data is windowed here, the windowed data divided into partial sequences and Fourier-transformed and periodograms are determined from this that can be used to determine the transmission function, in this instance the admittance function, in the frequency range.

However, alternatively to the above, a correlogram method, also known in the literature under the name Blackman-Tukey estimation, can be used. Here, the spectral estimation takes place on the basis of an autocorrelation function (AKF) and a cross correlation function (KKF) that is calculated from the test signal (excitation signal) and from the measured signal (response signal). In this formulation the spectral power density is obtained by Fourier transformation of the previously estimated AKF and KKF. However, the Welch method furnishes more robust results.

Starting from the presentation of a known transmission function present in the frequency range, for example, of the admittance course, the equivalent circuit parameters of the three-phase motor can be extracted. There have already been a few numeric attempts to this end. The Levenberg-Marquardt algorithm can be used with particular advantage in a further development of the invention in order to identify the equivalent circuit parameters by a determination of the transmission function parameters.

Alternatively, for example, a method according to Nelder and Mead can be used whereby, however, the Levenberg-Marquardt algorithm furnishes more robust results, in particular in the case of data records with a lot of noise. It belongs to the group of gradient methods, whereby better parameter vectors corresponding to the coefficients of the transmission function can be calculated by iterative minimizing of an error function. The Levenberg-Marquardt method is considered at the present as the standard method for non-linear optimizations. It is a mixture of gradient methods and inversion of a Hesse matrix and is also designated in the literature as the method with steepest descent. The inversion of the Hesse matrix is also designated as the Gauss-Newton method. A detailed presentation of the use of the Levenberg-Marquardt algorithm is presented in publication [1], whereby starting from a transmission function:

$$G = Y = \frac{1}{b_1 s + b_0}$$

and with a pattern of the frequency response of the system, the unknown coefficients $b_0$ and $b_1$ can be determined. In comparison to the above-cited admittance presentation, the coefficients correspond to the physical parameters $b_0 = R_1$, $b_1 = L_1$. By determining the unknown coefficients $b_0$ and $b_1$ the equivalent circuit parameters $R_1$ and $L_1$ can be determined.

According to an advantageous further development of the invention the identified equivalent circuit parameters can be used in an adjustment and/or optimization of inverter control parameters and/or for motor monitoring. In the regulating of modern synchronous machines motor control apparatuses are used that can control the inverter appropriately given rapid speed changes or when making available dynamically regulatable output energy based on the knowledge of the electrical equivalent circuit parameters, and can set the phase drive voltages in such a manner that the machine can optimally meet the desired work tasks without overshootings. In this connection the concepts control and regulation are used synonymously. The knowledge of the equivalent circuit parameters of the electrical stretch can consequently serve for the parameterization of the current regulator, whose requirement for a high dynamic range is the greatest as the innermost regulator. In particular, demanding regulating methods that go beyond those of conventional PI regulators require a very precise knowledge of the machine parameters, in particular of the equivalent circuit parameters. In particular state space regulators, dead-beat regulators or model sequence regulators are to be cited here. Since in particular senssorless motor controls are being used in recent times, the equivalent circuit parameters of three-phase motors already integrated or replaced in the mechanical drive line are determined in a complex machine environment, and the motor regulator is adjusted on site.

The equivalent circuit parameters reproduce the electrical motor behavior, so that in particular during the regulation of complex transient transition processes of the machine a precise controlling of the inverter becomes possible. A regulator adjustment free of overshootings and an optimized rapid dynamic regulation of the motor becomes possible here. In particular, the use of such an optimized motor regulation is conceivable, given exact knowledge of the equivalent circuit parameters, in the area of printing machines, machines for producing and working plastic surfaces or of roller machines and packaging machines in which dynamic-optimized motor control methods must be used. In particular in the case of four-color printing machines the slightest deviations in the color printing are recognizable in motor control inaccuracies. In the production of extremely smooth and thin plastic surfaces a uniform thickness of the plastic layer can only be achieved with optimal regulation of the dynamic range, whereby no optical impurities of the plastic material can occur. During the analysis of the equivalent circuit parameters the rotor rests at standstill and can therefore be electrically identified in the assembled state without influence of the output line. A regulator parameterization serves to optimize the control parameters of the inverter, whereby a deviation of the equivalent circuit parameters from, for example, previous measurements can be taken into account for the error monitoring of the motor or for controlling wear. In particular, the use of the method in the framework of a condition monitoring of the motor can be advantageous, so that from time to time the method can re-determine the equivalent circuit parameters, adaptively adapt the rotor regulator and can emit an error signal in the case of noticeable deviations from previously identified or presettable parameter values, so that the motor or control electronics can be checked.

A coordinate aspect of the invention suggests an identification device for the identification without a shaft encoder of electrical equivalent circuit parameters of a three-phase synchronous motor suitable for carrying out a method in accordance with one of the previously cited methods. The identification device comprises to this end an inverter interface unit that can be connected to an inverter control device for the controlling communication and for the determination of the rotor standstill position. The interface unit furthermore comprises a test signal generation device for generating a d/q test signal, a U/V/W transformation unit for transforming the d/q test signal into a U/V/W control test signal, a d/q transformation for transforming measured U/V/W measuring signal currents into d/q measuring signal currents and comprises a parameter identification unit for the identification of equivalent circuit parameters.

Thus, this invention relates to an identification apparatus that is designed for performing a previously cited method and opens up the possibility to this end of communicating by an inverter interface unit with an inverter control apparatus, in particular with the semiconductor components of the inverter, in order to switch them or to query their operating state. A standstill of the rotor can be determined by deactivation of the inverter and/or activation of a brake for some time. In addition, for example, speed sensors or shaft encoder sensors can furnish information about a standstill of the rotor and optionally about a rotor angle $\beta_k$ of the d axis opposite the α axis. These sensors are, however, not necessary for the identification of parameters as a heuristic knowledge about an assumed rotor standstill can suffice in most instances. The identification device comprises a test signal generation device that can generate a d test signal, whereby the test signal, in particular a PRB noise signal, can be converted by a U/V/W transformation unit as a function of the rotor angle $\beta_k$ into a corresponding U/V/W control test signal that can be supplied to the inverter control device. In the motor the control test signal generates corresponding test signal voltages in the three motor phases. Furthermore, the identification apparatus comprises a d/q transformation unit that can convert the measured $I_U$, $I_v$ and $I_w$ measured signal currents into d/q measured signal currents $I_d$ and $I_q$ and comprises a parameter identification unit that, starting from the test signal voltage $U_d$ present in the time range and from the measured signal current $I_d$, can carry out a parameter identification according to previously cited methods. Such an identification apparatus can be constructed in a multipartite manner, whereby the motor controller of a motor control apparatus can be used to generate the test signal. The measured current can also be recorded by the motor control apparatus. An external computer can read out the measured and supplied voltages and currents, transform them into the frequency range and carry out a parameter identification.

According to an advantageous further development of the identification apparatus the parameter identification unit can comprise a Fourier transformation means, in particular an FFT/DFT means for the Fourier transformation of discontinuous d/q scanning signal values according to the Welch method and comprise a parameter determination means, in particular a Levenberg-Marquardt transmission function-parameter determination means. Accordingly, the parameter identification unit comprises a Fourier transformation means for transferring the supplied and measured voltage- and current time scan values $U_{1d}$, $I_{1d}$ and comprises a parameter determination means that, starting from the transmission function $G_1$ present in the frequency range, can carry out a determination of the transmission function coefficients $b_0$ and $b_1$ and from this of the system parameters. The calculating processes necessary for this can be performed, for example, in a DSP, a microcontroller of an FPGA, in a PC or a small computer, whereby a logical and structural separation between test signal generation, measured value storage, Fourier transformation and parameter determination is possible. The signal processing and the subsequent numeric process can advantageously be provided as software implementation at least partially on a motor regulator or motor control apparatus.

Thus, it is conceivable to build the Fourier transformation means up as FPGA in order to realize a rapid Fourier transformation with the aid of a static switching circuit, and to implement the parameter identification means as variable calculating software on a high-performance DSP of a motor control regulator. A test signal production and measured value storage can be carried out in an inverter motor control device. Fourier transformation and parameter identification can also take place by a motor control device or by an external identification apparatus that comprises an interface to the communication with the motor control device. Thus, the motor control device can be provided with low calculating power, and demanding theoretical signal tasks can be processed in an external identification apparatus that can be connected to the motor control device, as a result of which hardware expense can be saved.

According to an advantageous further development the apparatus can furthermore comprise a monitoring and optimization unit that is set up to determine, optimize and/or monitor control parameters of an inverter control apparatus on the basis of the identified equivalent circuit parameters. The monitoring and optimization unit receives the determined characteristic quantities of the parameter identification unit and can optimize control parameters of the motor control device on the basis of the determined equivalent circuit parameters, in particular as regards a dynamic regulator behavior and/or filter properties in order to reduce the effects of the inductive behavior of the synchronous motor on the mains. Furthermore, an efficient operation of the motor control can be optimized and motor changes monitored and/or an error signal can be emitted in the case of a motor failure or erroneous behavior. The equivalent circuit parameters required for this can be routinely re-performed in the framework of a conditioning monitoring by the monitoring and optimization unit after a certain time interval or, for example, when replacing the motor or motor parts.

In a coordinate aspect the invention suggests a motor control device for the shaft-encoderless control or regulation of a three-phase synchronous motor that comprises a previously described identification apparatus for the shaft-encoderless identification of electrical equivalent circuit parameters, whereby the identified equivalent circuit parameters can be used for the determination, optimization and monitoring of the motor and/or of the motor control. Thus, this aspect suggests a motor control device that can perform in a customary manner a sensor-based or shaft-encoderless control of the speed behavior of the synchronous motor and that comprises an identification apparatus or communicates with such an identification apparatus, and that uses the identified equivalent circuit parameters for the optimization of the regulating behavior, for the determination of electrical magnitudes for the control of the motor and for the monitoring of an error-free behavior of the synchronous motor and/or of the motor control. Thus, the determined equivalent circuit parameters can serve for the optimal adjustment of control characteristics so that a dynamic regulatory behavior can become possible without overshootings. Thus, the identified parameters can be used for the optimization of the current consumption and of the energy efficiency of the synchronous motor and be used, for example, for a filter parameterization for adjusting electronic filters, or they can be used for monitoring the error-free behavior of the motor control device and/or of the synchronous motor. In the case of a predeterminable deviation of the identified parameters in contrast to previously determined or given equivalent circuit parameters an instance of an error can be assumed or a new determination of the equivalent circuit parameters carried out. In the case of a repair or the replacement of the motor, the motor control device can adaptively identify the equivalent circuit parameters of the new motor and adjust itself in an optimal fashion to the new motor. A self-calibration of the motor control device can take place in the workplace or during the assembly of the machine at the customer's or in the running operation in the framework of a condition monitoring.

An advantageous further development suggests that the motor control device is arranged in such a manner that an automated identification of the equivalent circuit parameters can be carried out during a rotor standstill at least during the first startup, preferably several times in the course of the service life, whereby an error signal can be initiated upon a demonstrable deviation of the identified equivalent circuit parameters from previously determined, stored and/or model-related equivalent circuit parameters. Thus, this aspect suggests that a parameter identification is carried out at least upon a first-time startup or upon a test run in the workplace but preferably in the framework of a condition monitoring or during a repair or exchange of parts of the motor, whereby the motor control device can consider these equivalent circuit parameters for optimization, adjustment and monitoring of the motor. Thus, a "universal" motor control device can be created that can adapt itself in an adaptive manner to an entire series of different synchronous motors, whereby an identification of the electrical magnitudes can be performed at the motor standstill. Changes in the motor that are conditioned by age can be taken into account by an adaptive correction of the regulator parameters and erroneous functions of the motor or of the monitoring of the motor control can be recognized.

Finally, a coordinate aspect of the invention suggests a usage of the previously cited method for the determination, optimization and monitoring of motor regulating parameters for the control and/or regulation of electrical drives, in particular for the adjusting of regulating parameters of a motor control device. It is suggested in this aspect that the determined equivalent circuit parameters are used for regulation optimization, parameterization and monitoring. A determination of the equivalent circuit parameters can be carried out, for example, for a construction series of synchronous motors once on a pattern motor and corresponding regulating parameters can be optimized and adapted for the motor control devices used for this purpose. This can take place in the workshop. If an identification apparatus is provided or can be externally connected in a motor control device, this apparatus can perform a new identification of the parameters in the assembled state of the motor upon the first startup, during repair measures or in routine or running monitoring of the status (condition monitoring). To this end parts of the method such as the frequency range transformation and the determination of parameters can be carried out on an external computer and other parts such as, for example, the supplying of the test signal and the conversion of the three-phase system into the two coordinate system are carried out in the motor control device. However, it is decisive that the identified equivalent circuit parameters can be used for the optimal regulator parameterization, filter adjustment and electrical dimensioning of structural parts.

DRAWINGS

Further advantages result from the following description of the drawings. Exemplary embodiments of the present invention are shown in the drawings. The drawings, specification and the claims contain numerous features in combination. The person skilled in the art will consider the features even individually in a purposeful manner and combine them to logical further combinations.

The figures show by way of example:

Figure 3:
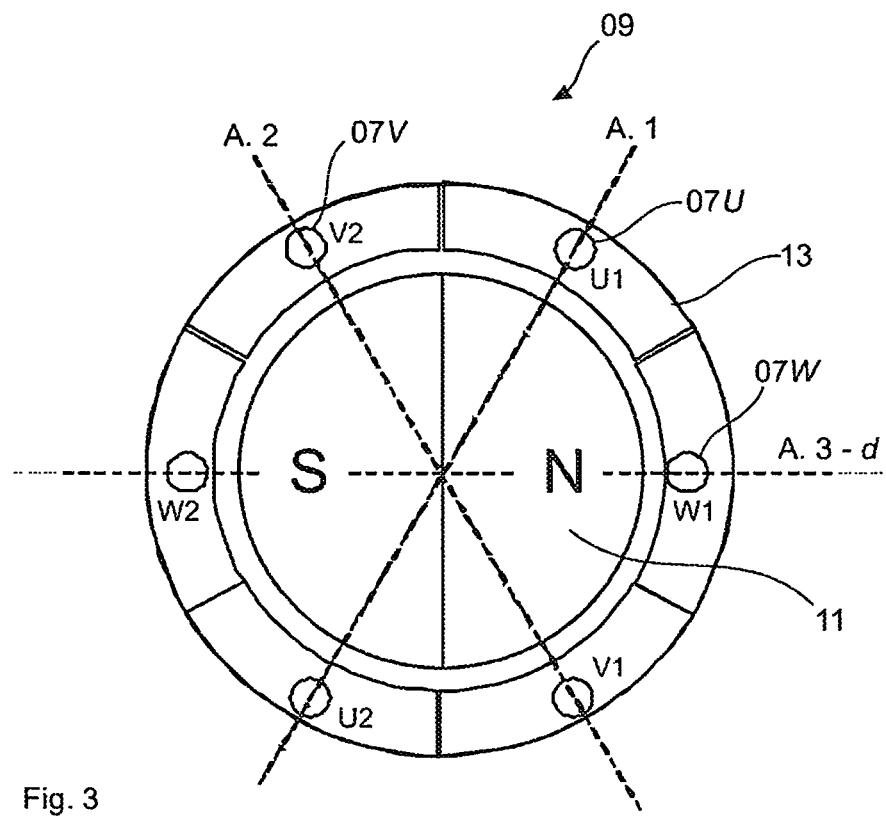
Figure 4:
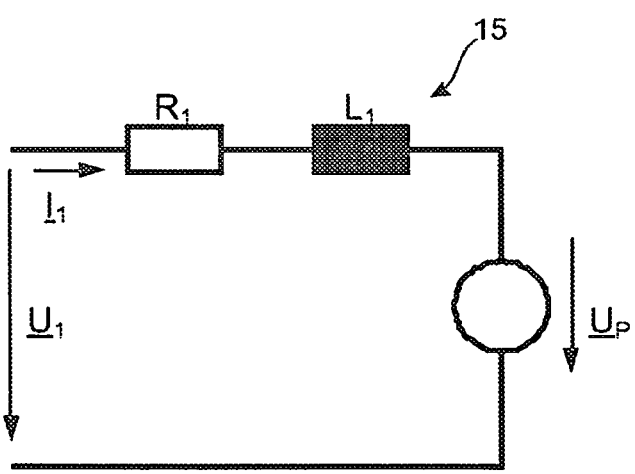
Figure 5:
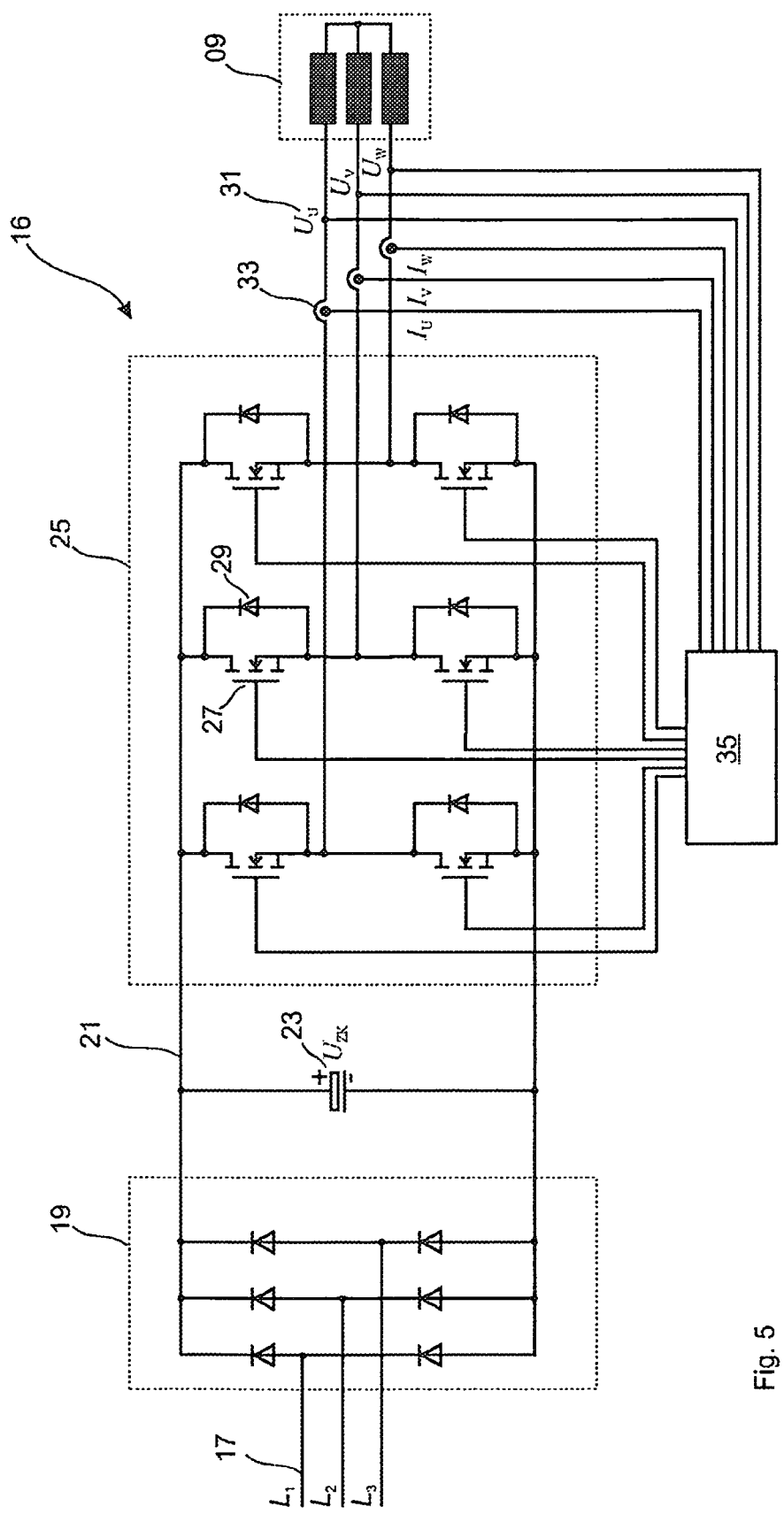
Figure 6:
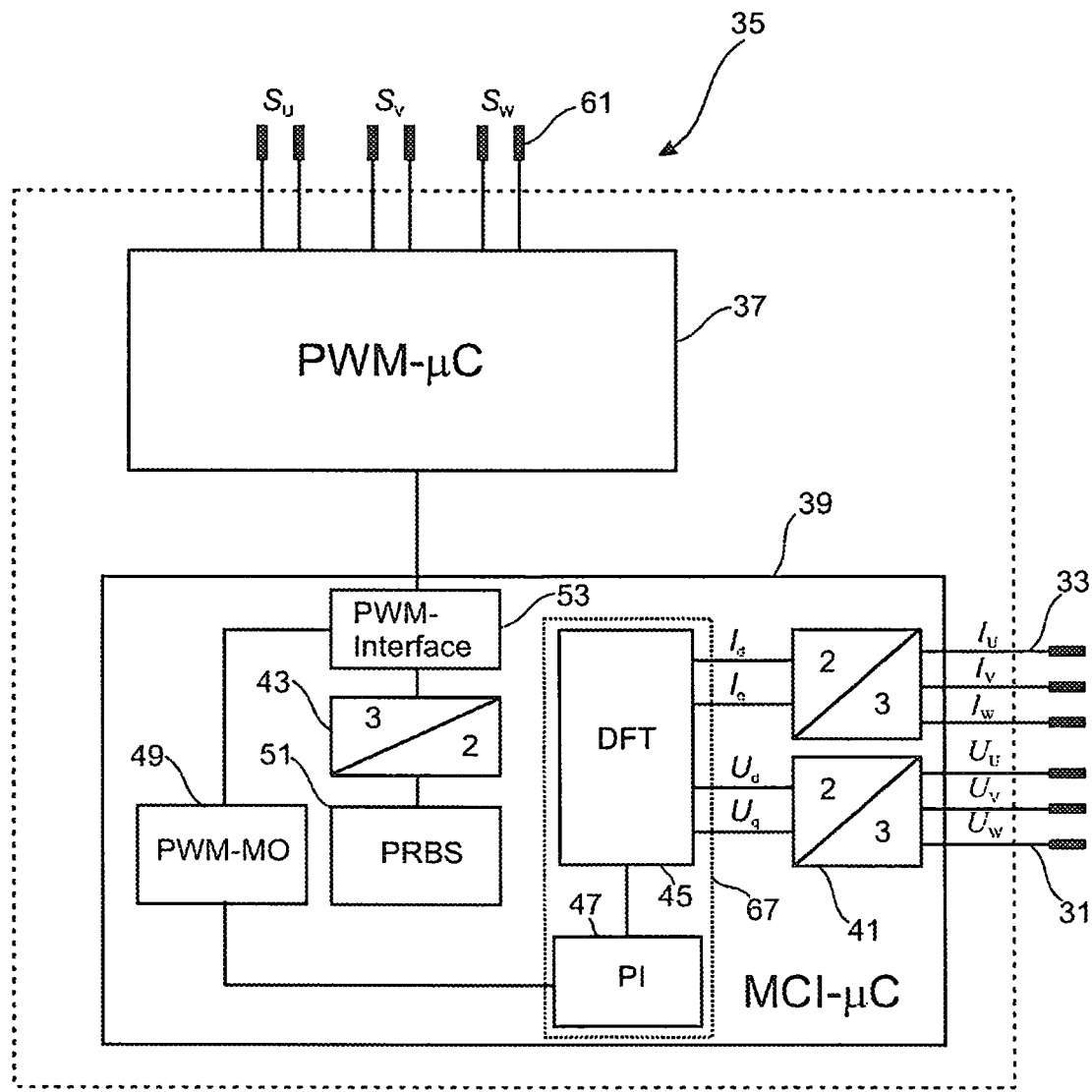
Figure 7:
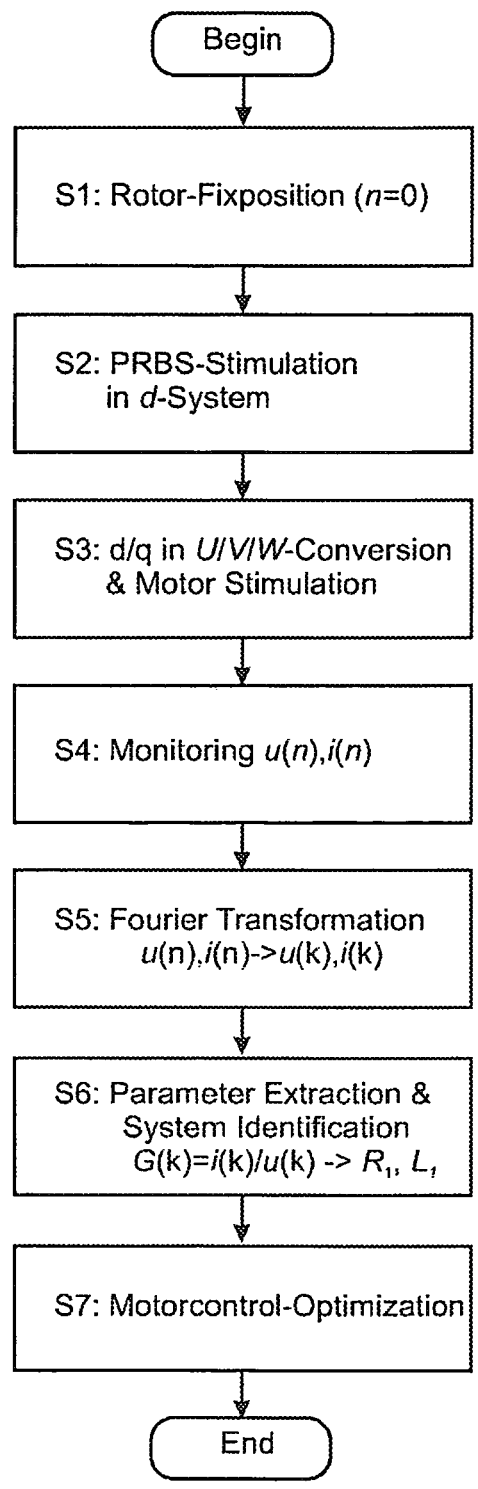
Figure 8:
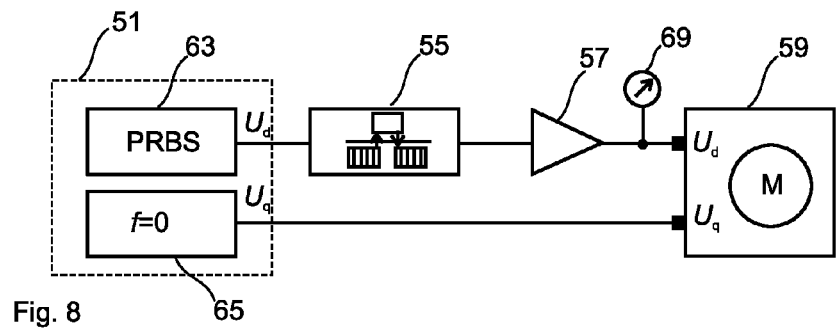

FIG. 3 schematically shows a construction of an asynchronous motor with squirrel-cage rotor;

FIG. 4 shows a T-equivalent circuit of an synchronous motor;

FIG. 5 shows a first exemplary embodiment of a motor control device of the invention;

FIG. 6 shows an exemplary embodiment of a motor control apparatus in accordance with the invention;

FIG. 7 shows an operating sequence of an exemplary embodiment of the method in accordance with the invention;

FIG. 8 schematically shows an exemplary embodiment of a test signal supply into a mathematical model of a synchronous motor;

FIG. 9 shows an amount phase course of an admittance from measured time range data when using a method in accordance with the invention;

FIG. 10 shows rotor position behavior in asymmetrical and symmetrical test signal infeed.

EMBODIMENTS OF THE INVENTION

In the figures the same or similar components are designated with the same reference numbers.

Figure 1:
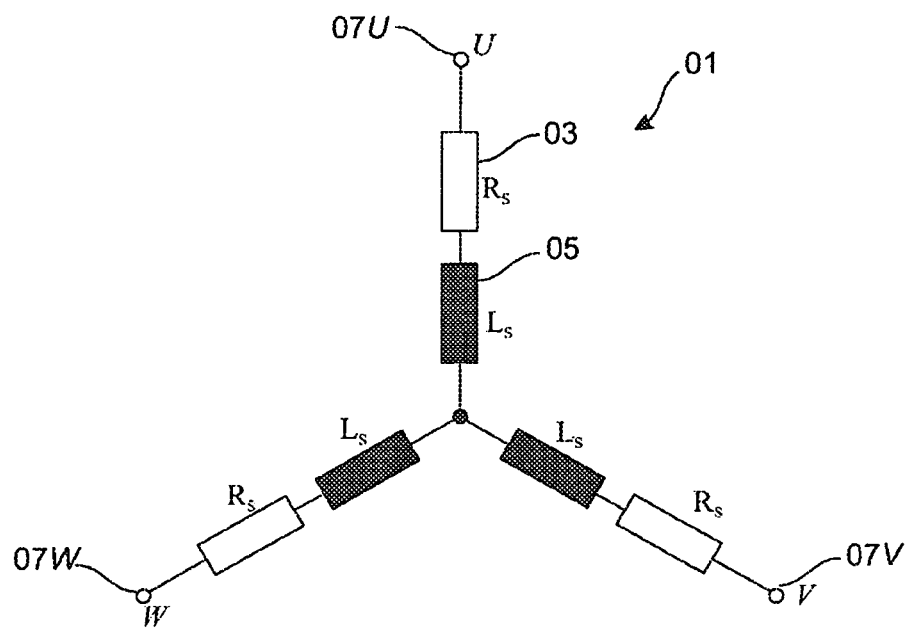
FIG. 1 shows an equivalent circuit of a stator coil of an asynchronous motor in a star connection.

In order to explain the invention FIG. 1 shows an equivalent circuit of the stator coil 0103-phase motor. Each coil strand U, V and W comprises a resistor $R_s$ 03 and a inductivity $L_s$ 05. The three coil strands 07 are connected to each other at their first end and at their second end to the three phases U, V, W of the output of an inverter. The stator coil 01 integrates with the rotatably mounted rotor coil 11, that has a constant magnetization in a determination flux axial direction. The rotor magnetic field can be generated by permanent magnets attached along the circumference of the rotor or by a direct current in a rotor winding which direct current is supplied via slip rings. The rotor magnetic field adheres to the rotating stator magnetic field and thus allows the rotor to rotate in the frequency of the stator magnetic field. The system of rotor coil 11 and stator coil 01 can be considered, instead of in a three-phase system U/V/W, in a stator two-coordinate system α/β or rotor two-coordinate system d/q, from which the equivalent circuit of the motor shown in FIG. 4 can be derived.

Figure 2:
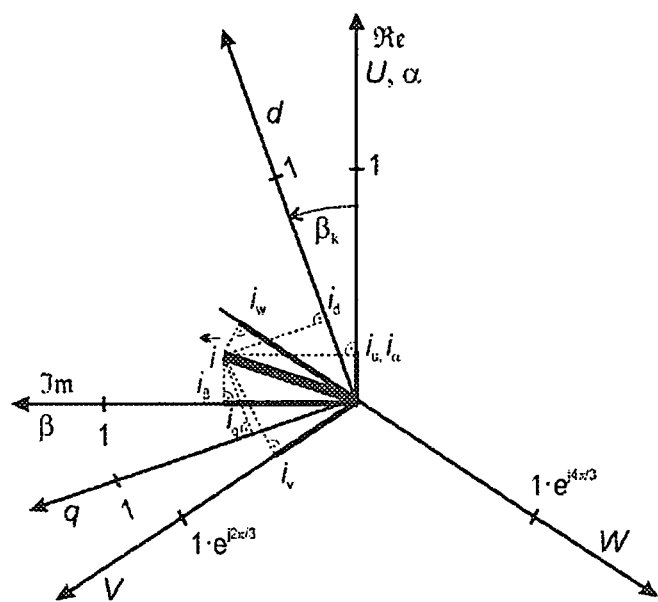
FIG. 2 shows a view of the relation between two-component-and three-phase coordinate systems.

To this end FIG. 2 at first shows the spatial association of the three-phase system U/V/W with three coordinate directions 1 (0°), $e^{j2\pi/3}$ (120°) and $e^{j4\pi/3}$ (240°) compared to the α/β coordinate system of the complex plane with real part α and imaginary part β. Under the assumption of a total current I the latter can be divided relative to the three-phase system into three partial currents $I_U$, $I_V$ and $I_W$. In the same manner the current can be expressed by the partial currents in complex stator-fixed coordinate systems $I_\alpha$ and $I_\beta$. The relationship between $I_\alpha$, $I_\beta$ and $I_U$, $I_V$ and $I_w$ has already been indicated further above. When using the complex representation $I_\alpha$ and $I_\beta$, which indicate the stationary stator axis directions and the three phase currents $I_U$, $I_V$ and $I_W$, the above transformation specifications can be derived. The rotor has a rotating coordinate system d/q that comprises the rotor flux axis d and transverse flux axis q. The association between the rotating coordinates d/q and the stationary coordinates α/β can be established by the rotor angle of rotation $\beta_k$.

FIG. 3 schematically shows the construction of a permanent magnet three-phase synchronous motor 09 (PMSM). This motor comprises in a simple embodiment a three-phase stator 13 with the coil strands U1, U2 (07-U), V1, V2 (07-V) and W1, W2 (07-W). The stationary stator coils define three coil axes A1, A2 and A3 that correspond to the three phase axes 1, $e^{j2\pi/3}$ and $e^{j4\pi/3}$. Rotor 11 comprises a permanently equipped rotor [sic—with a permanent magnet?], whereby the permanent magnetic field of the rotor 11 adheres to the electrically rotating stator magnetic field and thus brings about a torque, so that the rotor 11 is put in rotation. Furthermore, FIG. 4 shows the equivalent circuit of a synchronous motor with the phase current $I_1$ and the phase voltage $U_1$. The voltage source $U_p$ constitutes the counter-induction action of the magnetic field effect of the rotor in the rotor coil. The equivalent circuit according to FIG. 4 describes the electrical processes in the stator coil 01 with $R_1$, $L_1$ 03, 05. Based on the equivalent circuit, the following admittance function can be derived:

$$G = Y = \frac{1}{R_1 + sL_1} = \frac{1}{b_0 + sb_1}$$

The present invention now has the problem of determining the equivalent circuit magnitudes $R_1$, $L_1$ presented in FIG. 4. Starting from the knowledge of the equivalent circuit magnitudes, given supplied voltages $U_d$ the adjusting current $I_d$ can be predicted, whereby desired speeds and torques can be optimized by adjusting the regulating parameters. A description of the transient behavior is essential here, whereby a single analysis of the electrical behavior of the motor supplies the most exact knowledge possible about the equivalent circuit parameters.

FIG. 5 schematically shows a motor control circuit 16 in which the phases of a three-phase supply circuit 17 are converted by a three-phase bridge rectifier 19 into a direct voltage of a DC intermediate circuit 21. A buffer capacitor 23 is provided in the DE intermediate circuit 21 which capacitor smoothes the voltage and, for example, can make buffer energy available for a regulated emergency operation of the motor 09 in case of a power failure. An inverter 25 comprises three switching bridges in which power semiconductor switching elements 27 can switch the motor phases U/V/W opposite the direct voltage +DC and −DC of the intermediate circuit 21 in a coordinated manner and thus make available a PWM-modeled control voltage $U_u$, $U_v$, $U_w$ for the three-phase motor 09 in a speed-variable manner. Each power semiconductor switching element 27, that can comprise an IGBT transistor, a bipolar power transistor or the like is protected against overvoltage, in particular inductive reaction by the motor 09, by a free-wheeling diode 29. The phase voltages $U_u$, $U_v$, $U_w$ as well as phase currents $I_u$, $I_v$, $I_w$ are tapped off in the supply lines to three-phase motor 09 and supplied to a motor control device 35. The phase voltages do not have to be necessarily tapped off, since they can be given by the inverter 25, whereby it is assumed that the theoretical voltage value corresponds to the actual voltage value.

The motor control device 35 comprises control lines in order to regulate the individual power semiconductor switching elements 27 in the correct phase depending on the desired speed behavior of the motor 09. In the case of a sensor-based regulation the motor control device 35 is furthermore coupled to position angle sensors and acceleration sensors, whereby temperature sensors can also be connected for monitoring the operating temperature of the motor 09. In the case of a field-oriented regulation without shaft encoder the motor control device 35 can carry out a speed-optimized control of the inverter switching components 27 solely by knowledge of the phase voltages 31 and measured phase currents 33. The regulating parameters of the motor control device 35 can be adjusted by knowledge of the electrical behavior of the motor 09, that can be described by the equivalent circuit shown in FIG. 4. To this end the motor control device 35 comprises an identification apparatus 39 like the one shown in FIG. 6.

FIG. 6 shows an exemplary embodiment of a motor control device 35 that comprises an identification apparatus 39 for the extraction of the equivalent circuit parameters of the three-phase synchronous motor 09. The motor control device 35 comprises inputs for detecting the three phase currents $I_u$, $I_v$, and $I_w$ as well as detecting the three phase voltages $U_u$, $U_v$ and $U_w$ 31 of the three-phase motor 09, whereby a detection of only two phase voltages and phase currents is sufficient, since the third magnitude results according to Kirchhoff. Furthermore, the motor control device 35 comprises switching outputs 61 for outputting inverter switching signals for actuating the power semiconductor switching elements 27 of the inverter 25. The phase-correct generation of the inverter switching signals 61 takes place by a PWM (Pulse-Width Modulation) microcontroller that represents an inverter control apparatus 37 in order to carry out a regulation of speed and torque of the three-phase motor 09 without sensors or also sensor-supported. The identification apparatus 39 receives the phase voltages 31 and phase currents 33 and comprises a d/q transformation unit 41 that converts the phase voltages and phase currents into the partial voltage $U_d$, $U_q$ as well as partial currents $I_d$, $I_q$ of the complex two-coordinate system. The converted phase voltages and phase currents are supplied to a parameter identification unit 67 comprising on the one hand a Fourier transformation means 45 and on the other hand a parameter extraction means 47. A Fourier transformation is applied to the time range data of the phase voltages in phase currents so that this data can be present in the frequency range and the above-defined admittance transmission function $G_1$ can be formed. Instead of the admittance function, parameters of another transmission function, in particular impedance function or other logical electrical functional relations can be taken as base and their parameters determined. Starting from the courses of the transmission functions, the parameter identification unit 67 of the parameter extraction means 47, given knowledge of the admittance description function constituting the base, can extract the parameters to be identified from the curve courses. From this, the equivalent circuit parameters $R_1$, $L_1$ of the equivalent circuit shown in FIG. 4 can be determined, and on their basis an optimization unit 49, that can perform a modulation of the motor as well as an optimizing of parameter adjustments of the generation of pulse width, can generate control parameters as well as filter parameters for the parameterizing, optimizing and monitoring of the inverter control device 37. The latter are forwarded to a PWM interface 53 and can thus be transmitted to the inverter control device 37 in order to make possible an optimal regulation of the synchronous motor.

Test signals are supplied in the framework of the parameter extraction which can be generated via a test signal generation unit 51. In this exemplary embodiment a pseudo-noise binary signal (PRBS) is generated as test signal that makes the noise signal uniformly available as $U_\alpha$, $U_\beta$ by a U/V/W transformation unit 43 and is distributed onto the three phase voltages $U_U$, $U_V$ and $U_W$. This input signal is forwarded to the inverter control device 37, that accordingly controls the inverter 25 in such a manner that the motor 09 is supplied with current in accordance with the test signal.

FIG. 7 shows an exemplary embodiment of a program operating plan for carrying out a method in accordance with the invention. In step S1, at first the rotor is brought into a defined fixed position and standstill position in which the speed n equals 0. In step S2 the supplying of a test signal is carried out as a PRB signal into the d main magnetic flux axis of the rotor. This is an essential prerequisite so that no torques of the rotor can occur.

A conversion is carried out from the d/q test signals into the phase voltages $U_U$, $U_V$ and $U_W$ and the motor is controlled therewith. The controlled voltage signals U(n) as well as the measured current values I(n) are scanned in the time range and converted by a Fourier transformation, in particular a DFT (Discrete Fourier Transformation) or FFT (Fast Fourier Transformation) using a Welch method into the frequency range, i.e. in this instance into the Laplace range so that the frequency range values U(k), I(k) result. In the Laplace range a transmission function of the admittance can be represented as $$G(k) = I(k)/U(k),$$

that forms the starting basis for the parameter extraction. Given knowledge of the transmission function, the equivalent circuit parameters $R_1$, $R'_2$, $L_1$, $L'_2$ and $L_h$, of the pole pair number p and the magnitude of the DC current of the α axis, a parameter extraction, for example, building on the Levenberg-Marquardt algorithm, can be carried out by a system identification in order to determine the transmission coefficients $b_0$ and $b_1$ from the course of the curve. From this, the values of the equivalent circuit parameters $R_1$, $L_1$ can be derived and used for adjusting motor control parameters, for optimizing load changes or torque changes and for adjusting and designing filter parameters for a filtering of motor currents or motor voltages. Given the knowledge of the equivalent circuit parameters of the electrical stretch a parameterization of the inverter control device 37 can be performed, whereby a high dynamic of the motor behavior can be achieved by optimizing the regulatory behavior of the inverter control device 37 as the innermost regulator. Demanding regulating methods that go far beyond the possibilities of a conventional PI regulator of the synchronous motor can be achieved here since a precise knowledge of the electrical machine parameters is present. In particular, the regulator parameters for a state space regulator, dead-beat regulator or a model sequence regulation can be exactly adjusted.

Figure 10A:
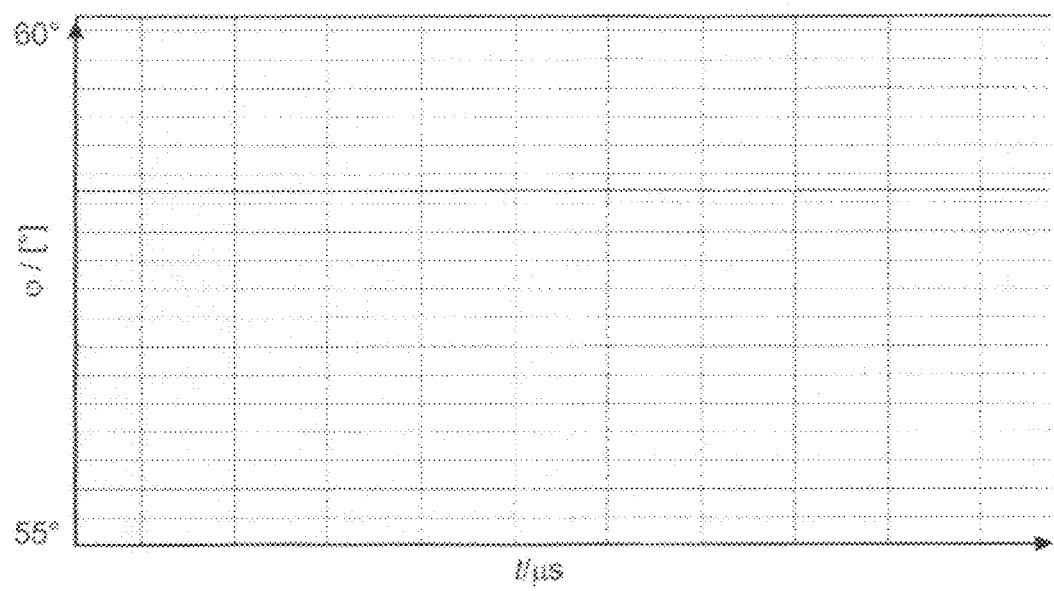
Figure 10B:
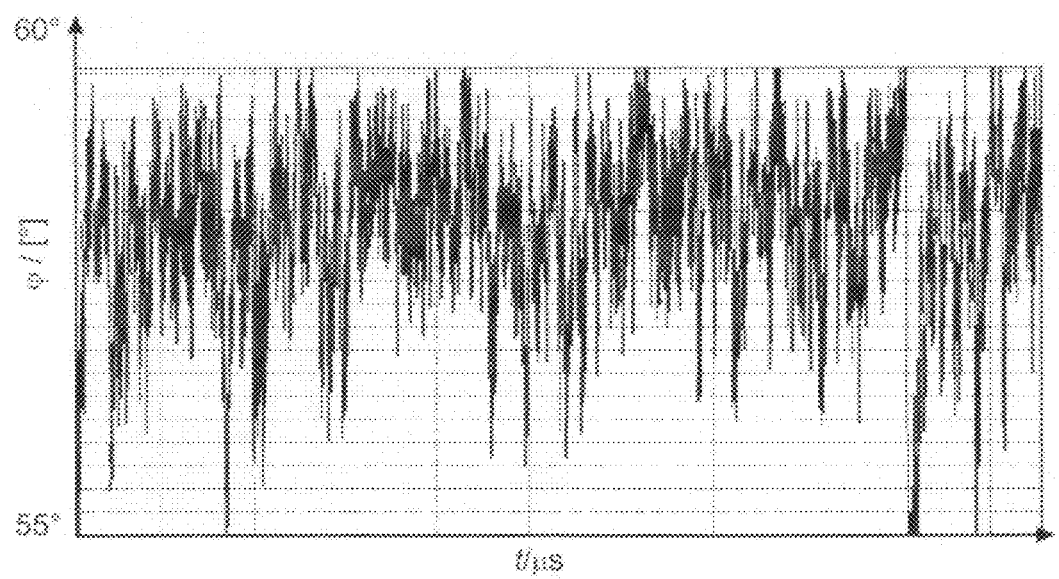

FIG. 8 schematically shows the supplying of a test signal of a test signal generation unit 51 into a mathematical model of a three-phase motor 59 as a d/q model in the framework of a Matlab-Simulink simulation. The test signal generation unit 51 comprises a d test signal generation means 63 that generates a pseudo-noise binary signal that is made available in the cycle of an inverter control device 37 that operates as a rule with 16 kHz clock rate, i.e., 62.5 μs clock time. Since the d/q motor model 59 can be modeled with quasi-analog signals, a scanning elevation unit 55 is interconnected that generates a quasi-continuous test signal from the roughly scanned 16 kHz test signal. This test signal is supplied amplified by a test signal amplifier 57 as motor voltage $U_d$ into the d/q synchronous motor model 59. Parallel to this, a q test signal generation means 65 also comprised by the test signal generation unit 51 generates a zero signal or a direct voltage signal that is supplied as transverse axis voltage $U_q$ into the synchronous motor model 59. A simulation takes place thereby with Matlab-Simulink, in order to carry out a mathematical verification of the method. Starting from the numeric simulation, the courses of the phase currents are recorded by a signal recording unit 69, from which a resulting torque of 0 results, as shown in FIG. 10a. Accordingly, it can be concluded that in the case of the initial equations at the base of the method a stationary, torque-free rotor is to be expected with asymmetric supplying of the test signal.

Figure 9A:
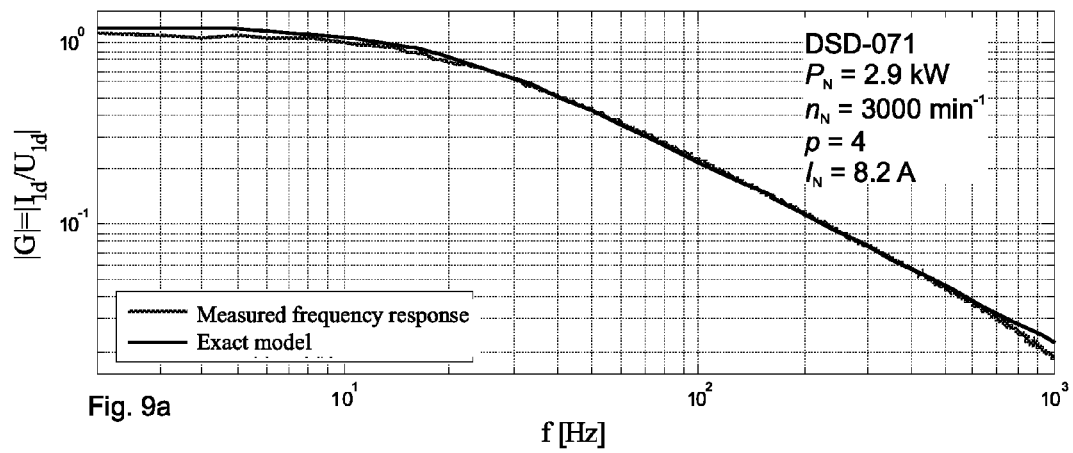
Figure 9B:
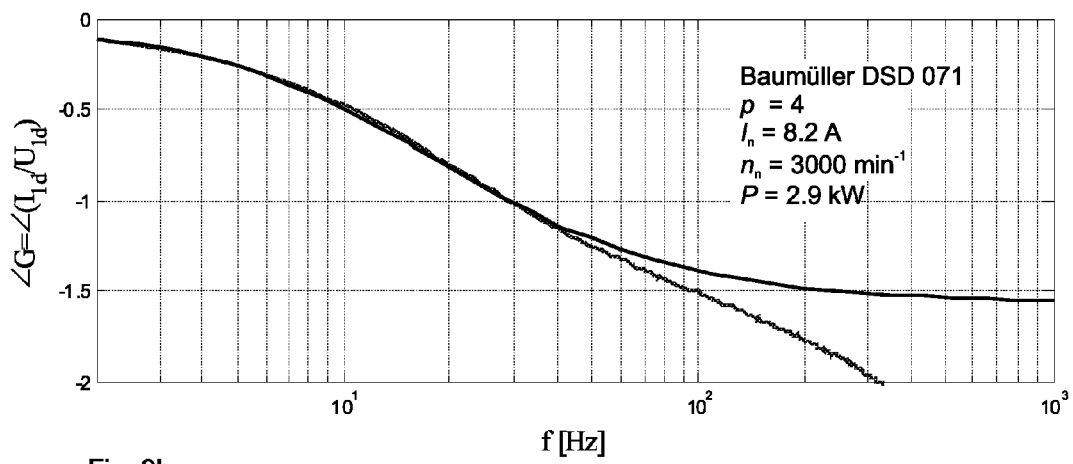

FIGS. 9a and 9b show an amount-and phase course over a frequency range of 0-1 kHz of the admittance function G=Y that was derived from the identified electrical system and from the exact machine model. It can be clearly recognized that the transmission function $G_1$ almost identically coincides with the exact machine model had has a theoretically predictable PT1 behavior. The motor considered is a Baumüller DSD071 motor with a rated power of $P_N$=2,9 kW, rated speed of $n_N$=3000$^{-1}$, a pole pair number p=4 and a rated current of $I_N$=8.2 A. Thus, a verification of the theoretical model can be demonstrated by numeric simulation. Starting from the scanned phase voltages and phase currents measured in the time range, an almost identical system characterization of the mechanical behavior of the pre-phase motor 09 can be derived.

FIG. 10a shows an oscillogram course of the measured position signals during the self-identification and using a method in accordance with the invention. It can be recognized that the angle of rotation φ is stationary during the test signal supply and measuring, since in the case of an asymmetrical supply of the test signals no torque is produced that can put the rotor 11 in rotation. Otherwise, however, it is in the angular course φ of the rotor according to FIG. 10b, whereby in this instance a symmetrical test signal supply into both channels d/q of the synchronous motor 09 was carried out for a countercheck. It can be clearly recognized that during a supply into the d as well is into the q axis the rotor is not stationary during the measuring but rather moves back and forth in a high-frequency manner. In an assembled state the mechanical drive line would move and furnish a measurement falsified by the drive line. This shows that only an asymmetrical supply of the test signal into the d coordinate directions of the motor 09 yields usable results.

The basic idea of the invention is based on a signal-theoretical consideration of a three-phase selector motor in a two-coordinate space d/q, whereby evaluation signals, measuring signals measured as motor currents are present by means of an asymmetrical supplying of a broad-band test signal, preferably of a PRB signal, as motor voltages in the direction of the d main magnetic flux axis of the rotor, which evaluation signals and measuring signals can be transformed into the frequency range preferably by a Welch method. Building on this, transmission functions can be extracted from the supplied and measured signals and the basic system description parameters can be evaluated by a parameter identification method, preferably a Levenberg-Marquart algorithm. Given knowledge of the formula relation of the transmission functions, the individual functional parameters can be identified and therewith the electrical behavior of the motor characterized over a large frequency range. The invention especially emphasizes the special supply type, the structure of the transmission function and the analysis specification, in which a determination of the electrical equivalent circuit magnitudes becomes possible when the rotor is stationary. The method illustrates the transient behavior of the motor over a large operating frequency range or speed range and can be used to adjust, optimize and monitor the motor. In particular when used in a motor control device, a universal motor control device can be made available and can be adaptively used in the workshop or after the assembly of the motor when coupled to a mechanical output line for determining the motor behavior. This makes possible a determination of the parameters describing the machine which is rapid and protects the motor. The method can be retrofitted using software technology into existing motor control devices such as, for example, the Baumüller b_maXX motor controls and servo-regulators, in particular the b_maXX 1000-5000 and opens up an automated identification and monitoring of the parameters describing the motor.

Baumüller Nürnberg GmbH B002/446EP
90482 Nuremberg Spa

LIST OF REFERENCE NUMERALS 01 stator coils equivalent circuit of a synchronous motor
03 coil resistor
05 coil inductivity
07 U/V/W coil strand
09 synchronous motor 11 rotor
13 stator
15 equivalent circuit of a stator coil of a synchronous motor
16 motor control circuit
17 AC supply mains
19 three-phase bridge rectifier
21 DC intermediate circuit
23 buffer capacitor
25 inverter
27 power semiconductor switching element
29 free-wheeling diode
31 phase voltage
33 phase current
35 motor control device
37 inverter control apparatus
39 identification apparatus
41 α/β transformation unit
43 U/V/W transformation unit
45 Fourier transformation means
47 parameter determination means
49 optimization unit
51 test signal generation unit
53 inverter control interface unit
55 scan rate raising unit
57 test signal amplifier
59 α/β synchronous model
61 inverter switching signals
63 d test signal generation means
65 q test signal generation means
67 parameter identification unit
69 signal recording unit

The invention claimed is:

1. A method for the identification without shaft encoder of electrical equivalent circuit parameters (03, 05, 15) of a three-phase synchronous motor (09) having a rotor and a stator, the method comprising at least the steps:
  (a) bringing the rotor (11) to a standstill position, so that the d flux axial direction of the rotor is aligned opposite the α axial direction of the stator (13);
  (b) applying a test signal voltage $U_{1d}$ in the d flux axial direction of the synchronous motor (09), whereby the q transverse axial direction remains without current;
  (c) measuring a signal current $I_{1d}$ of the d flux axial direction of the synchronous motor (09);
  (d) identifying equivalent circuit parameters (03, 05, 15) of the synchronous motor (09) based on the test signal voltage $U_{1d}$ and on the signal current $I_{1d}$ in the d flux axial direction;
  whereby the supplying of the test signal into the synchronous motor (09) takes place in such a manner that the rotor (09) remains torque-free.

2. The method according to claim 1,
characterized in that
the standstill position is a rest position of the rotor (11), at which the d flux axial direction coincides with the α axial direction, or is a previously known rotor position or a forced standstill obligatory position by a constant supplying of the synchronous motor (09) with current in an α axial direction.

3. The method according to claim 2, characterized in that the test signal is a pseudo-noise binary signal.

4. The method according to claim 3 characterized in that the identification of the equivalent circuit parameters (03, 05, 15) comprises a Fourier transformation of time-discrete signals according to a Welch method.

5. The method according to claim 3, characterized in that the identification of the equivalent circuit parameters (03, 05, 15) comprises a transmission function determination of parameters.

6. The method according to claim 3, characterized in that the identified equivalent circuit parameters (03, 05, 15) are used in an adjustment or optimization of inverter control parameters or for motor monitoring.

7. An identification apparatus (39) for the identification without shaft encoder of electrical equivalent circuit parameters (03, 05, 15) of a three-phase asynchronous motor (09), the apparatus comprising an inverter interface unit (53) that can be connected to an inverter control device (37) for controlling communication and for determination of the rotor position,
characterized in that
the identification device (39) furthermore comprises a test signal generation apparatus (51) for generating a d/q test signal, a U/V/W transformation unit (43) for transforming the d/q test signal into an U/V/W control test signal, a d/q transformation unit (41) for transforming measured U/V/W measuring signal currents into d/q measuring signal currents and comprises a parameter identification unit (67) for identifying equivalent circuit parameters (03, 05, 15).

8. The apparatus according to claim 7,
characterized in that
the parameter identification unit (67) comprises a Fourier transformation means (45), in particular an FFT/DFT means for the Fourier transformation of discontinuous d/q signal values according to the Welch method and comprises a parameter determination means (47).

9. The apparatus according to claim 8,
and further comprising
a monitoring and optimization unit (49) that is set up to determine, optimize or monitor control parameters of the inverter control device (37) on the basis of the identified equivalent circuit parameters (03, 05, 15).

10. A motor control device (35) for the shaft-encoderless control of a three-phase asynchronous motor (09),
and comprising
an identification apparatus (39) for the shaft-encoderless identification of electrical equivalent circuit parameters (03, 05, 15) of a three-phase synchronous motor (09) including an inverter interface unit (53) that can be connected to an inverter control device (37) for controlling communication and for determination of the rotor position, the identification apparatus (39) further comprises a test signal generation apparatus (51) for generating a d/q test signal, a U/V/W transformation unit (43) for transforming the d/q test signal into an U/V/W control test signal, a d/q transformation unit (41) for transforming measured U/V/W measuring signal currents into d/q measuring signal currents and comprises a parameter identification unit (67) for identifying equivalent circuit parameters (03, 05, 15) whereby the identified equivalent circuit parameters (03, 05, 15) can be used for the determination, optimization and monitoring of the motor control.

11. The device according to claim 10,
characterized in that
the device is arranged in such a manner that an automated identification of the equivalent circuit parameters (03, 05, 15) is performed during a rotor standstill at least during the first startup whereby an error signal can be initiated upon a demonstrable deviation of the equivalent circuit parameters (03, 05, 15) from previously determined, stored and/or model-related equivalent circuit parameters (03, 05, 15).

12. The method of claim 3 and further comprising adjusting regulator parameters of a motor control device (35).

* * * * *